(12) United States Patent
Liang

(10) Patent No.: US 9,448,868 B2
(45) Date of Patent: Sep. 20, 2016

(54) DATA STORING METHOD, MEMORY CONTROL CIRCUIT UNIT AND MEMORY STORAGE APPARATUS

(71) Applicant: PHISON ELECTRONICS CORP., Miaoli (TW)

(72) Inventor: Ming-Jen Liang, Hsinchu (TW)

(73) Assignee: PHISON ELECTRONICS CORP., Miaoli (TW)

( * ) Notice: Subject to any disclaimer, the term of this patent is extended or adjusted under 35 U.S.C. 154(b) by 162 days.

(21) Appl. No.: 14/297,649

(22) Filed: Jun. 6, 2014

(65) Prior Publication Data

US 2015/0293809 A1  Oct. 15, 2015

(30) Foreign Application Priority Data

Apr. 10, 2014 (TW) .............................. 103113207 A

(51) Int. Cl.

| | |
|---|---|
| *G06F 11/07* | (2006.01) |
| *G11C 16/34* | (2006.01) |
| *G11C 29/52* | (2006.01) |
| *G06F 11/10* | (2006.01) |
| *G06F 3/06* | (2006.01) |
| *G06F 12/02* | (2006.01) |
| *G11C 29/42* | (2006.01) |

(52) U.S. Cl.
CPC .......... *G06F 11/076* (2013.01); *G06F 11/073* (2013.01); *G06F 11/1068* (2013.01); *G11C 16/344* (2013.01); *G11C 29/52* (2013.01); *G06F 3/064* (2013.01); *G06F 3/0614* (2013.01); *G06F 3/0619* (2013.01); *G06F 3/0679* (2013.01); *G06F 11/0766* (2013.01); *G06F 11/0793* (2013.01); *G06F 11/1072* (2013.01); *G06F 12/0246* (2013.01); *G06F 2212/2022* (2013.01); *G11C 29/42* (2013.01)

(58) Field of Classification Search
CPC .......... G06F 12/0246; G06F 11/1068; G06F 11/1072; G06F 3/0679; G06F 11/076; G06F 3/0619; G06F 3/0614; G06F 3/064; G06F 11/0766; G06F 2212/2022; G06F 11/0793; G06F 11/073; G11C 29/42; G11C 29/52; G11C 16/344
USPC .......................... 711/103, E12.008; 714/704; 365/185.33
See application file for complete search history.

(56) References Cited

U.S. PATENT DOCUMENTS

| | | | |
|---|---|---|---|
| 6,396,748 B1 * | 5/2002 | Fujita ..................... | G11C 29/72 365/200 |
| 9,025,380 B1 * | 5/2015 | Gjorup .................. | G11C 16/10 365/185.02 |
| 2009/0055680 A1 * | 2/2009 | Honda ................ | G06F 11/1068 714/5.1 |

(Continued)

*Primary Examiner* — Cynthia Britt
*Assistant Examiner* — Sazzad Hossain
(74) *Attorney, Agent, or Firm* — Jianq Chyun IP Office

(57) ABSTRACT

A data storing method, a memory control circuit unit, and a memory storage apparatus are provided. The method includes recording a bit error count of every predetermined area of every physical erasing unit and determining whether the bit error count of one of the predetermined areas of the physical programming unit of the physical erasing unit is more than a threshold bit error count. If the bit error count of one of the predetermined areas of the physical programming unit of the physical erasing unit is more than the threshold bit error count, the method also includes storing data under a second programming mode after an erasing operation is performed on the physical easing unit. Accordingly, defective physical erasing units may be effectively employed to prolong the lifespan of the memory storage apparatus.

33 Claims, 8 Drawing Sheets

(56) References Cited

U.S. PATENT DOCUMENTS

| | | | | |
|---|---|---|---|---|
| 2012/0272123 A1* | 10/2012 | Yeh | G06F 12/0246 | 714/773 |
| 2012/0278651 A1* | 11/2012 | Muralimanohar | G11C 29/76 | 714/6.11 |
| 2013/0094292 A1* | 4/2013 | Park | G11C 11/5628 | 365/185.03 |
| 2013/0124787 A1* | 5/2013 | Schuette | G06F 12/0246 | 711/103 |
| 2013/0275651 A1* | 10/2013 | D'Abreu | G11C 11/5628 | 711/103 |
| 2014/0032813 A1* | 1/2014 | Liu | G11C 16/10 | 711/103 |
| 2014/0032993 A1* | 1/2014 | Yang | G06F 11/1068 | 714/773 |
| 2014/0269090 A1* | 9/2014 | Flynn | G11C 16/14 | 365/185.19 |
| 2014/0281769 A1* | 9/2014 | Ohshima | G11C 29/42 | 714/721 |
| 2014/0293692 A1* | 10/2014 | Chen | G11C 16/06 | 365/185.11 |
| 2015/0106667 A1* | 4/2015 | Zeng | G11C 16/3409 | 714/704 |
| 2015/0135023 A1* | 5/2015 | Mekhanik | G11C 16/3427 | 714/704 |

* cited by examiner

US 9,448,868 B2

DATA STORING METHOD, MEMORY CONTROL CIRCUIT UNIT AND MEMORY STORAGE APPARATUS

CROSS-REFERENCE TO RELATED APPLICATION

This application claims the priority benefit of Taiwan application serial no. 103113207, filed on Apr. 10, 2014. The entirety of the above-mentioned patent application is hereby incorporated by reference herein and made a part of this specification.

BACKGROUND

1. Technology Field

The present invention relates to a data storing method for a rewritable non-volatile memory module, a memory control circuit unit using the method, and a memory storage apparatus using the method.

2. Description of Related Art

Digital cameras, mobile phones, and MP3 players have undergone rapid growth in recent years, so that consumers' demands for storage media have also increased drastically. Since a rewritable non-volatile memory is characterized by non-volatility of data, low power consumption, small volume, non-mechanical structure, and fast reading and writing speed, the rewritable non-volatile memory is the most adaptable memory to be applied in a portable electronic product, e.g., a notebook computer. A solid state drive (SSD) is a storage apparatus which utilizes a flash memory as its memory storage medium. Therefore, the flash memory industry has become a very popular part of the electronic industry in recent years.

Among the rewritable non-volatile memories, an NAND flash memory is one of the memories which have been extensively used; according to the number of bits which can be stored by each memory cell, the NAND flash memory may be classified into a single level cell (SLC) NAND flash memory, a multi level cell (MLC) NAND flash memory, and a trinary level cell (TLC) NAND flash memory. Specifically, each memory cell in the SLC NAND flash memory stores 1 bit of data (i.e., "1" or "0"), each memory cell in the MLC NAND flash memory stores two bits of data, and each memory cell in the TLC NAND flash memory stores three bits of data.

In the NAND flash memory, a physical programming unit is composed of several memory cells arranged on the same word line. Since each memory cell in the SLC NAND flash memory is capable of storing 1 bit of data, several memory cells arranged on the same word line in the SLC NAND flash memory correspond to one physical programming unit.

By contrast, a floating gate storage layer in each memory cell of the MLC NAND flash memory is capable of storing two bits of data, and each storage state (i.e., "11," "10," "01," and "00") includes the least significant bit (LSB) and the most significant bit (MSB). For instance, the first bit from the left of the storage states is the LSB, and the second bit from the left of the storage states is the MSB. Accordingly, several memory cells arranged on the same word line may constitute two physical programming units, wherein the physical programming units constituted by the LSB and the MSB of the memory cells are lower physical programming units and upper physical programming units, respectively.

In comparison with the SLC NAND flash memory, the MLC NAND flash memory has larger capacity and costs less, and thus the industry prefers the latter in the memory storage apparatus having the rewritable non-volatile memory module. However, the stability of the MLC NAND flash memory is inferior to that of the SLC NAND flash memory, and thus the bit error count may increase if the number of times of the erasing operations on some physical erasing blocks of the MLC NAND flash memory is insufficient. To prevent loss of data in the physical erasing units with a great number of error bits, once the bit error count is detected to exceed a normal value during a data reading process, the system often moves the data; therefore, the data written into the defective physical erasing units having a great number of error bits are required to be moved again, which compromises the overall performance of the system.

SUMMARY OF THE INVENTION

The present invention is directed to a data storing method, a memory control circuit unit, and a memory storage apparatus; here, defective physical erasing units are re-used to effectively prolong the lifespan of the memory storage apparatus.

In an exemplary embodiment of the present invention, a data storing method for a rewritable non-volatile memory module is provided. The rewritable non-volatile memory module has a plurality of physical erasing units, and each of the physical erasing units includes a plurality of physical programming units, and the physical programming units include a plurality of lower physical programming units and a plurality of upper physical programming units. The data storing method includes: selecting a first physical erasing unit from the physical erasing units, wherein each of the physical programming units of the first physical erasing unit has one or more predetermined areas. The data storing method further includes: storing first data with a first programming mode, wherein the first data is programmed into at least one of the lower physical programming units and at least one of the upper physical programming units of the first physical erasing unit. The data storing method further includes: recording a bit error count of each of the one or more predetermined areas of the first physical erasing unit and determining whether the bit error count of at least one of the one or more predetermined areas of the physical programming units of the first physical erasing unit is more than a threshold bit error count. The data storing method further includes, if the bit error count of the at least one of the one or more predetermined areas of the physical programming units of the first physical erasing unit is more than the threshold bit error count, storing second data with a second programming mode after erasing the first data from the first physical erasing unit. Here, the required number of times of programming the rewritable non-volatile memory module with the first programming mode is more than the required number of times of programming the rewritable non-volatile memory module under the second programming mode.

In an exemplary embodiment of the present invention, a data storing method for a rewritable non-volatile memory module is provided. The rewritable non-volatile memory module has a plurality of physical erasing units, and each of the physical erasing units includes a plurality of physical programming units, each of which includes a plurality of lower physical programming units and a plurality of upper physical programming units. The data storing method includes: receiving first data and selecting a first physical erasing unit from the physical erasing units, wherein each of the physical programming units of the first physical erasing unit has one or more predetermined areas. The data storing method further includes: recording a bit error count of each of the one or more predetermined areas of the first physical erasing unit and determining whether the bit error count of at least one of the one or more predetermined areas of a first physical programming unit of the physical programming units of the first physical erasing unit is more than a threshold bit error count. The data storing method further includes: if the bit error count of the at least one of the one or more predetermined areas of the first physical programming unit is more than the threshold bit error count, programming the first data into a second physical programming unit of the physical programming units of the first physical erasing unit.

In an exemplary embodiment of the present invention, a memory control circuit unit configured to control a rewritable non-volatile memory module is provided, and the memory control circuit unit includes a host interface, a memory interface, and a memory management circuit. The host interface is configured for being coupled to a host system. The memory interface is configured for being coupled to the rewritable non-volatile memory module. Here, the rewritable non-volatile memory module has a plurality of physical erasing units, each of the physical erasing units has a plurality of physical programming units, and the physical programming units of each of the physical erasing units include a plurality of lower physical programming units and a plurality of upper physical programming units. The memory management circuit is coupled to the host interface and the memory interface and configured to select a first physical erasing unit from the physical erasing units, and each of the physical programming units of the first physical erasing unit has one or more predetermined areas. The memory management circuit is further configured to store first data with a first programming mode, and the first data is programmed into at least one of the lower physical programming units and at least one of the upper physical programming units of the first physical erasing unit. The memory management circuit is further configured to record a bit error count of each of the one or more predetermined areas of the first physical erasing unit and determine whether the bit error count of at least one of the one or more predetermined areas of the physical programming units of the first physical erasing unit is more than a threshold bit error count. If the bit error count of the at least one of the one or more predetermined areas of the physical programming units of the first physical erasing unit is more than the threshold bit error count, the memory management circuit stores second data with a second programming mode after erasing the first data from the first physical erasing unit. Here, the required number of times of programming the rewritable non-volatile memory module under the first programming mode is more than a required number of times of programming the rewritable non-volatile memory module under the second programming mode.

In an exemplary embodiment of the present invention, a memory control circuit unit configured to control a rewritable non-volatile memory module is provided, and the memory control circuit unit includes a host interface, a memory interface, and a memory management circuit. The host interface is coupled to a host system. The memory interface is coupled to the rewritable non-volatile memory module. The rewritable non-volatile memory module has a plurality of physical erasing units, each of the physical erasing units has a plurality of physical programming units, and the physical programming units of each of the physical erasing units include a plurality of lower physical programming units and a plurality of upper physical programming units. The memory management circuit is coupled to the host interface and the memory interface and configured to receive first data from the host system. The memory management circuit is further configured to select a first physical erasing unit from the physical erasing units, and each of the physical programming units of the first physical erasing unit has one or more predetermined areas. The memory management circuit is further configured to record a bit error count of each of the one or more predetermined areas of the first physical erasing unit and determine whether the bit error count of at least one of the one or more predetermined areas of a first physical programming unit of the physical programming units of the first physical erasing unit is more than a threshold bit error count. If the bit error count of the at least one of the one or more predetermined areas of the first physical programming unit is more than the threshold bit error count, the memory management circuit programs the first data into a second physical programming unit of the physical programming units of the first physical erasing unit.

In an exemplary embodiment of the present invention, a memory storage apparatus that includes a connection interface unit, a rewritable non-volatile memory module, and a memory control circuit unit is provided. The connection interface unit is coupled to a host system. The rewritable non-volatile memory module has a plurality of physical erasing units, each of the physical erasing units has a plurality of physical programming units, and the physical programming units of each of the physical erasing units include a plurality of lower physical programming units and a plurality of upper physical programming units. The memory control circuit unit is coupled to the connection interface unit and the rewritable non-volatile memory module and configured to select a first physical erasing unit from the physical erasing units. Each of the physical programming units of the first physical erasing unit has one or more predetermined areas. The memory control circuit unit is further configured to store first data with a first programming mode, and the first data is programmed into at least one of the lower physical programming units and at least one of the upper physical programming units of the first physical erasing unit. Besides, the memory control circuit unit is further configured to record a bit error count of each of the one or more predetermined areas of the first physical erasing unit and determine whether the bit error count of at least one of the one or more predetermined areas of the physical programming units of the first physical erasing unit is more than a threshold bit error count. If the bit error count of the at least one of the one or more predetermined areas of the physical programming units of the first physical erasing unit is more than the threshold bit error count, the memory control circuit unit stores second data with a second programming mode after erasing the first data from the first physical erasing unit. Here, the required number of times of programming the rewritable non-volatile memory module under the first programming mode is more than a required number of times of programming the rewritable non-volatile memory module under the second programming mode.

In an exemplary embodiment of the present invention, a memory storage apparatus that includes a connection interface unit, a rewritable non-volatile memory module, and a memory control circuit unit is provided. The connection interface unit is coupled to a host system. The rewritable non-volatile memory module has a plurality of physical erasing units, each of the physical erasing units has a plurality of physical programming units, and the physical programming units of each of the physical erasing units include a plurality of lower physical programming units and a plurality of upper physical programming units. The memory control circuit unit is coupled to the connection interface unit and the rewritable non-volatile memory module and configured to receive first data from the host system. The memory control circuit unit is further configured to select a first physical erasing unit from the physical erasing units, and each of the physical programming units of the first physical erasing unit has one or more predetermined areas. The memory control circuit unit is further configured to record a bit error count of each of the one or more predetermined areas of the first physical erasing unit and determine whether the bit error count of at least one of the one or more predetermined areas of a first physical programming unit of the physical programming units of the first physical erasing unit is more than a threshold bit error count. If the bit error count of the at least one of the one or more predetermined areas of the first physical programming unit is more than the threshold bit error count, the memory control circuit unit programs the first data into a second physical programming unit of the physical programming units of the first physical erasing unit.

In view of the above, the defective physical erasing unit having a great number of error bits may be re-used, and data errors caused by storing data into the physical programming unit having a great number of error bits can be prevented. As a result, the service life of the rewritable non-volatile memory can be extended, and the stability of the stored data can be enhanced.

It should be understood, however, that this Summary may not contain all of the aspects and embodiments of the invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
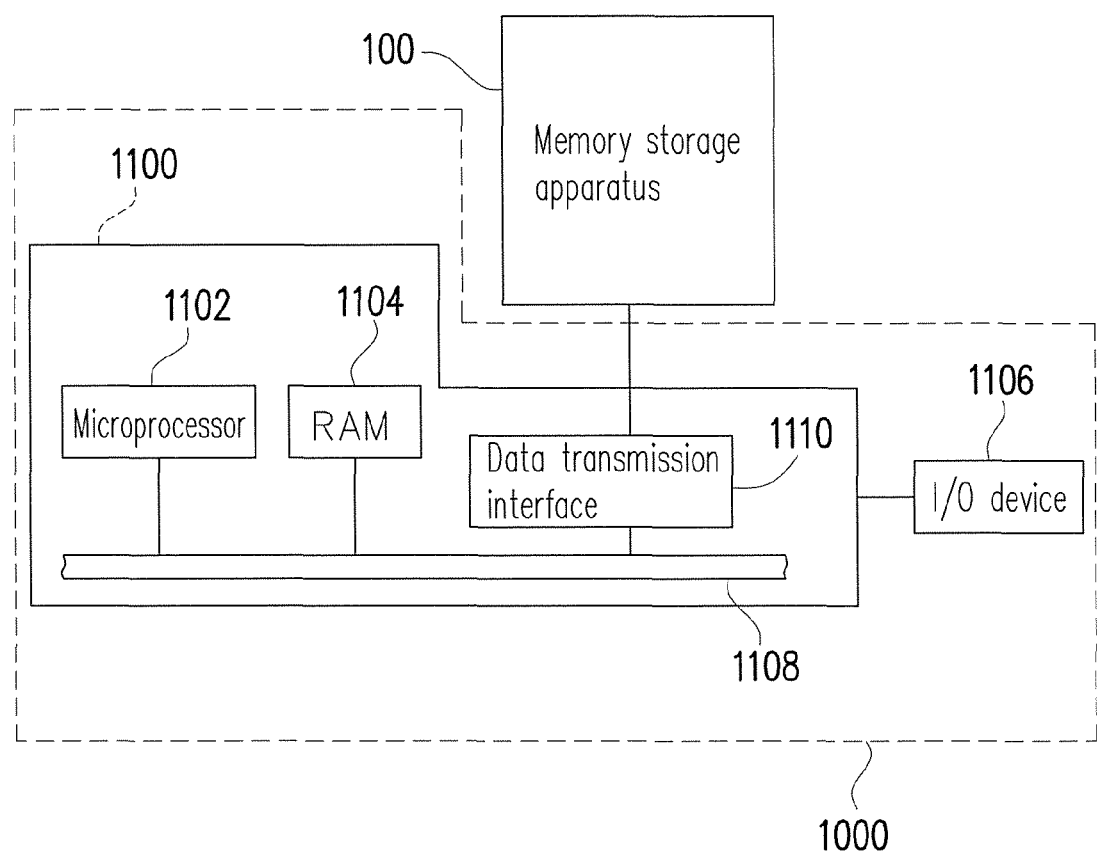
FIG. 1 illustrates a host system and a memory storage apparatus according to an exemplary embodiment of the invention.

Reference will now be made in detail to the exemplary embodiments of the invention, examples of which are illustrated in the accompanying drawings. Wherever possible, the same reference numbers are used in the drawings and the description to refer to the same or like parts. Embodiments of the invention may comprise any one or more of the novel features described herein, including in the detailed description, and/or shown in the drawings. As used herein, "at least one," "one or more," and "and/or" are open-ended expressions that are both conjunctive and disjunctive in operation. For instance, each of the expressions "at least on of A, B and C," "at least one of A, B, or C," "one or more of A, B, and C," "one or more of A, B, or C," and "A, B, and/or C" means A alone, B alone, C alone, A and B together, A and C together, B and C together, or A, B and C together. It is to be noted that the term "a" or "an" entity refers to one or more of that entity. As such, the terms "a" (or "an"), "one or more," d "at least one" can be used interchangeably herein.

First Exemplary Embodiment

FIG. 1 illustrates a host system and a memory storage apparatus according to an exemplary embodiment of the present invention.

Figure 2:
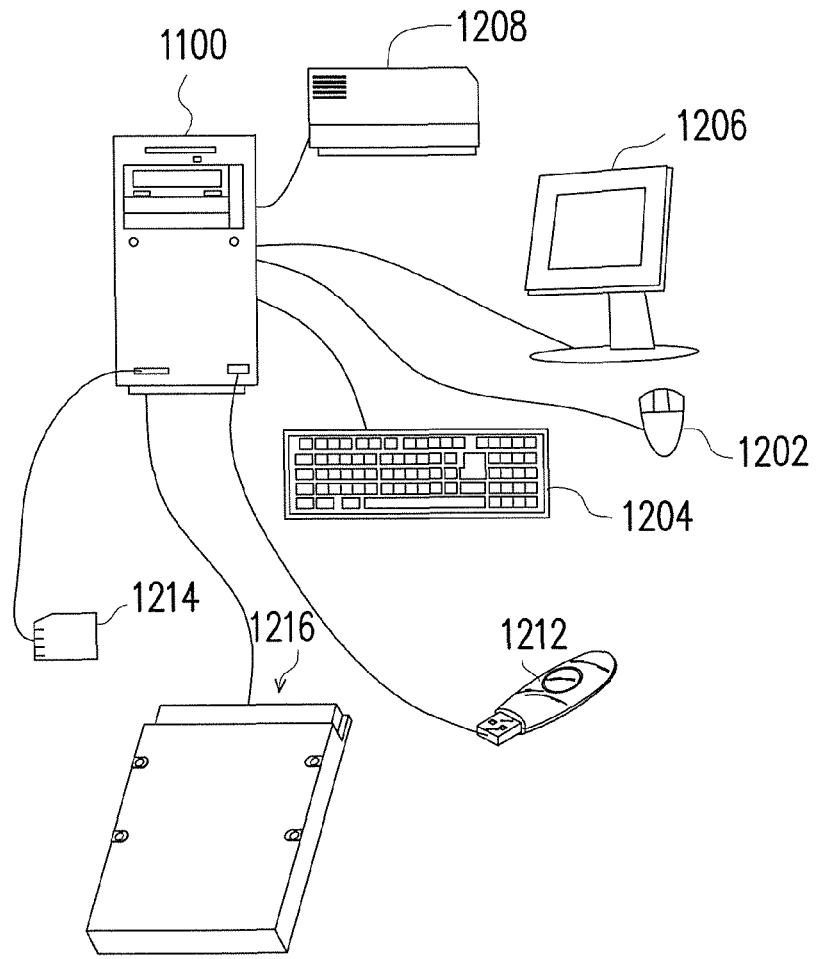
FIG. 2 is a schematic diagram illustrating a computer, an input/output (I/O) device, and a memory storage apparatus according to an exemplary embodiment of the invention.

With reference to FIG. 1, a host system 1000 normally includes a computer 1100 and an input/output (I/O) device 1106. The computer 1100 includes a microprocessor 1102, a random access memory (RAM) 1104, a system bus 1108, and a data transmission interface 1110. The I/O device 1106 includes a mouse 1202, a keyboard 1204, a display 1206, and a printer 1208 as shown in FIG. 2. It should be understood that the I/O device 1106 is not limited to include the devices shown in FIG. 2 and may further include other devices.

In the exemplary embodiment, the memory storage apparatus 100 is electrically connected to other devices of the host system 1000 through the data transmission interface 1110. Through operating the microprocessor 1102, the RAM 1104, and the I/O device 1106, the data can be written into or read from the memory storage apparatus 100. For instance, the memory storage apparatus 100 may be a rewritable non-volatile memory module storage apparatus, such as a flash drive 1212, a memory card 1214, or a solid state drive (SSD) 1216 shown in FIG. 2.

Figure 3:
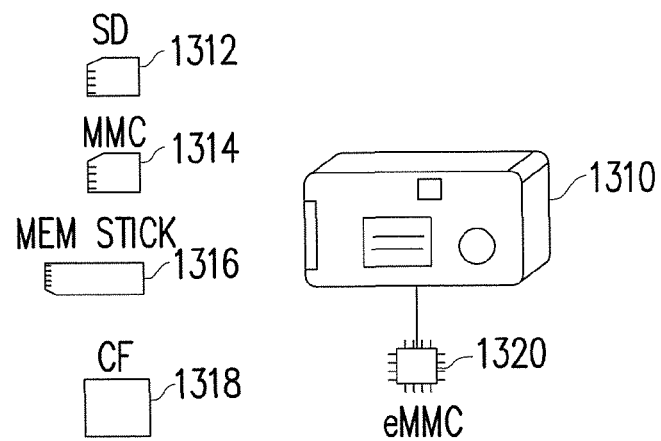
FIG. 3 is a schematic diagram illustrating a host system and a memory storage apparatus according to an exemplary embodiment of the invention.

Generally, the host system 1000 may be any system that can be substantively operated together with the memory storage apparatus 100 to store data. Even though the host system 1000 is described as a computer system in the present exemplary embodiment, the host system 1000 in other exemplary embodiments may be a digital camera, a video camera, a communication device, an audio player, a video player, and so forth. For instance, if the host system is a digital camera (a video camera) 1310, the rewritable non-volatile memory module storage apparatus is then an SD card 1312, an MMC card 1314, a memory stick 1316, a CF card 1318, or an embedded storage apparatus 1320 (as shown in FIG. 3). The embedded storage apparatus 1320 includes an embedded MMC (eMMC). It should be mentioned that the eMMC is directly electrically connected to the substrate of the host system.

Figure 4:
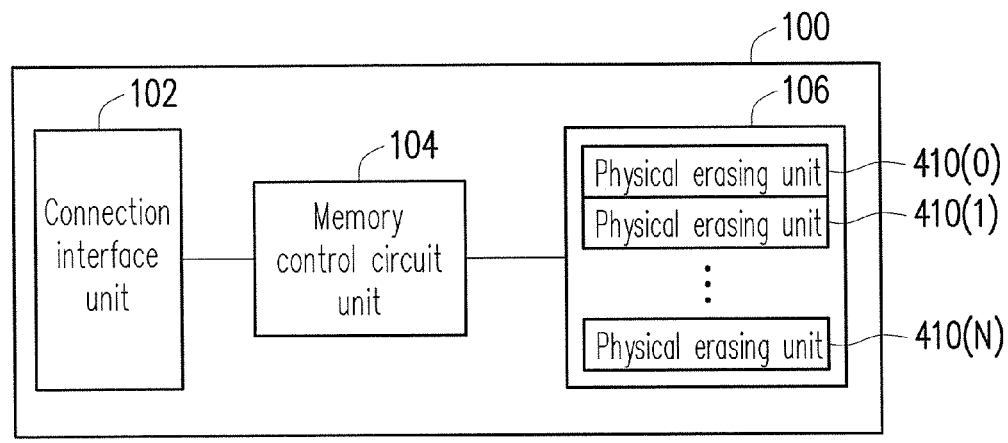
FIG. 4 is a simple block diagram illustrating the memory storage apparatus depicted in FIG. 1.

FIG. 4 is a simple block diagram illustrating the memory storage apparatus depicted in FIG. 1.

With reference to FIG. 4, the memory storage apparatus 100 includes a connection interface unit 102, a memory control circuit unit 104, and a rewritable non-volatile memory module 106.

In the present exemplary embodiment, the connection interface unit 102 complies with the serial advanced technology attachment (SATA) standard. However, it should be understood that the invention is not limited thereto, and the connection interface unit 102 may also comply with the parallel advanced technology attachment (PATA) standard, the Institute of Electrical and Electronic Engineers (IEEE) 1394 standard, the peripheral component interconnect (PCI) express standard, the universal serial bus (USB) standard, the ultra high speed-I (UHS-I) interface standard, the ultra high speed-II (UHS-II) interface standard, the serial advanced technology attachment (SATA) standard, the memory sick (MS) interface standard, the multi media card (MMC) interface standard, the compact flash (CF) standard, the integrated device electronics (IDE) standard, or other suitable standards. According to the present exemplary embodiment, the connection interface unit and the memory control circuit unit may be packaged into one chip, or the connection interface unit may be arranged outside a chip having the memory control circuit unit.

The memory control circuit unit 104 is configured to execute a plurality of logic gates or control instructions implemented in a hardware form or a firmware form and issue a command sequence to perform various data operations (e.g., data writing, reading, and erasing) on the rewritable non-volatile memory module 106 according to commands issued by the host system 1000.

The rewritable non-volatile memory module 106 is electrically connected to the memory control circuit unit 104 and configured for storing data written by the host system 1000. The rewritable non-volatile memory module 106 has a plurality of physical erasing units 410(0) to 410(N). For instance, the physical erasing units 410(0) to 410(N) may belong to the same memory die or belong to different memory dies. Each physical erasing unit has a plurality of physical programming units; for instance, in the present exemplary embodiment, each physical erasing unit includes 258 physical programming units, and data may be independently written into or simultaneously erased from the physical programming units belonging to the same physical erasing unit. However, the present invention is not limited thereto, and each of the physical erasing units may also be comprised of 64, 256, or any other number of physical programming units.

More specifically, the physical erasing unit is the smallest unit for erasing data; namely, each of the physical erasing units contains the least number of memory cells that are erased all together. The physical programming unit is the smallest unit for programming data; that is, each of the physical programming units is the smallest unit for writing data. Each physical programming unit usually includes a data bit area and a redundant bit area. The data bit area includes a plurality of physical access addresses for storing data of users, and the redundant bit area is configured for storing system data (e.g., control information and error correcting codes). In the present exemplary embodiment, each data bit area of the physical programming unit contains 4 physical access addresses, and the size of each physical access address is 512 bytes. However, in other exemplary embodiments, more or less number of the physical access addresses may be contained in the data bit area, and the amount and the size of the physical access addresses are not limited in the present invention. For instance, in an exemplary embodiment, the physical erasing units are physical blocks, and the physical programming units are physical pages or a physical sectors, which should however not be construed as limitations to the present invention.

According to the present exemplary embodiment, the rewritable non-volatile memory module 106 is an MLC NAND flash memory module (i.e., a flash memory module capable of storing 2 bits of data in one memory cell); however, the present invention is not limited thereto, and the rewritable non-volatile memory module 106 may also be an SLC NAND flash memory module (i.e., a flash memory module capable of storing 1 bit of data in one memory cell), a TLC NAND flash memory module (i.e., a flash memory module capable of storing 3 bits of data in one memory cell), another flash memory module, or another memory module having the same characteristics.

In the present exemplary embodiment, each physical erasing unit in the MLC NAND flash memory module has a plurality of physical programming units. One memory cell of each of the physical programming units is capable of storing 2 bits of data, and each of the physical programming units includes a plurality of lower physical programming units and a plurality of upper physical programming units. In most cases, if data are stored into the MLC NAND flash memory module, one of the lower physical programming units and one of the upper physical programming units are programmed with an MLC mode, so as to write the data into the memory cells.

It should be mentioned that the MLC mode belongs to the first programming mode. The second programming mode provided herein may include at least three of the following modes and may be at least any one of the following modes. In the SLC mode, one memory cell merely stores 1 bit of data. In the lower physical programming mode, only the lower physical programming unit is being programmed, and the corresponding upper physical programming unit is not programmed. In the mixture programming mode, real, valid data are programmed in the lower physical programming unit, while dummy data are programming in the upper physical programming unit corresponding to said lower physical programming unit.

The memory cells in the rewritable non-volatile memory module 106 store multiple bits of data by changing the voltage in a memory cell. Specifically, a charge trapping layer is between the control gate and the channel in each memory cell. The quantity of electrons in the charge trapping layer is changed by applying a writing voltage to the control gate, which leads to the variations in the threshold voltages of the memory cells. The process of changing the threshold voltages is also called a process of "writing data into the memory cells" or "programming the memory cells." Together with the variations in the threshold voltage, each memory cell in a memory cell array can have be in different storage states, and the actual storage state of each memory cell can be determined according to a reading voltage, and thereby the number of bits of data stored in each memory cell can be obtained. In the MLC NAND flash memory module described herein, for instance, under the first programming mode or the mixture programming mode, each memory cell has four storage states (i.e., "11," "10," "01," and "00") corresponding to different threshold voltages. Hence, in the present exemplary embodiment, each memory cell stores 2 bits of data. Besides, in the MLC NAND flash memory module described herein, under the second programming mode (e.g., the SLC mode) each memory cell has two storage states (i.e., "0" and "1") corresponding to different threshold voltages. Hence, in the present exemplary embodiment, each memory cell stores 1 bit of data. That is to say, if the data are programmed with the first programming mode or the mixture programming mode, each memory cell requires a relatively high threshold voltage for programming the data, or the number of bits of valid data stored in each memory cell is relatively significant; accordingly, the required number of times of programming the data with the SLC mode is less than the required number of times of programming the data under the mixture programming mode or less than the required number of times of programming the data with the first programming mode.

Figure 5:
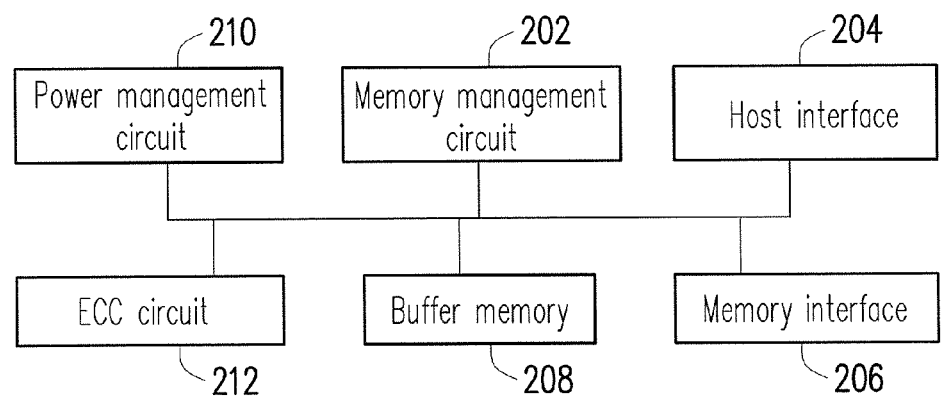
FIG. 5 is a simple block diagram illustrating a memory control circuit unit according to an exemplary embodiment of the invention.

FIG. 5 is a simple block diagram illustrating a memory control circuit unit according to an exemplary embodiment of the present invention.

With reference to FIG. 5, the memory control circuit unit 104 includes a memory management circuit 202, a host interface 204, and a memory interface 206.

The memory management circuit 202 is configured to control the overall operation of the memory control circuit unit 104. Particularly, the memory management circuit 202 has a plurality of control instructions; if the memory storage apparatus 100 is in operation, the control instructions are executed to perform data writing, reading, and erasing operations.

In the present exemplary embodiment, the control instructions of the memory management circuit 202 are implemented in a firmware form. For instance, the memory management circuit 202 has a microprocessor unit (not shown) and a read-only memory (ROM, not shown), and these control instructions are burnt into the ROM. If the memory storage apparatus 100 is in operation, the control instructions are executed by the microprocessor unit to write, read, and erase data.

In another exemplary embodiment of the invention, the control instructions of the memory management circuit 202 may also be stored in a specific area of the rewritable non-volatile memory module 106 (e.g., a system area of a memory module exclusively used for storing system data) in form of programming codes. Additionally, the memory management circuit 202 has a microprocessor unit (not shown), a ROM (not shown), and a RAM (not shown). In particular, the ROM has boot codes, and if the memory control circuit unit 104 is enabled, the microprocessor unit first executes the boot codes to load the control instructions from the rewritable non-volatile memory module 106 into the RAM of the memory management circuit 202. The microprocessor unit then runs the control instructions to write, read, and erase data.

Moreover, the control instructions of the memory management circuit 202 may also be implemented in a hardware form according to another exemplary embodiment of the invention. For instance, the memory management circuit 202 includes a microcontroller, a memory cell management circuit, a memory writing circuit, a memory reading circuit, a memory erasing circuit, and a data processing circuit. The memory cell management circuit, the memory writing circuit, the memory reading circuit, the memory erasing circuit, and the data processing circuit are electrically to the microcontroller. The memory cell management circuit is configured to manage physical erasing units of the rewritable non-volatile memory module 106. The memory writing circuit is configured to issue a write command to the rewritable non-volatile memory module 106 for writing data thereto. The memory reading circuit is configured to issue a read command to the rewritable non-volatile memory module 106 for reading data therefrom. The memory erasing circuit is configured to issue an erase command to the rewritable non-volatile memory module 106 for erasing data therefrom. The data processing circuit is configured to process data to be written to the rewritable non-volatile memory module 106 or data read from the rewritable non-volatile memory module 106.

The host interface 204 is electrically connected to the memory management circuit 202 and configured to receive and identify commands and data transmitted by the host system 1000. Namely, the commands and data from the host system 1000 are transmitted to the memory management circuit 202 through the host interface 204. In the present exemplary embodiment, the host interface 204 complies with the SATA standard. However, the present invention is not limited thereto, and the host interface 204 may also comply with the PATA standard, the IEEE 1394 standard, the PCI express standard, the USB standard, the UHS-I interface standard, the UHS-II interface standard, the MS standard, the MMC standard, the CF standard, the IDE standard, or any other appropriate data transmission standard.

The memory interface 206 is electrically connected to the memory management circuit 202 and configured to access the rewritable non-volatile memory module 106. Namely, data to be written into the rewritable non-volatile memory module 106 may be converted by the memory interface 206 into a format acceptable to the rewritable non-volatile memory module 106.

In an exemplary embodiment of the invention, the memory control circuit unit 104 further includes a buffer memory 208, a power management circuit 210, and an error checking and correcting (ECC) circuit 212.

The buffer memory 208 is electrically connected to the memory management circuit 202 and configured to temporarily store data and commands received from the host system 1000 or data received from the rewritable non-volatile memory module 106.

The power management circuit 210 is electrically connected to the memory management circuit 202 and configured to control the power supply of the memory storage apparatus 100.

The ECC circuit 212 is electrically connected to the memory management circuit 202, and configured for executing an error checking and correcting procedure to ensure data accuracy. To be specific, when the memory management circuit 202 receives a writing command from the host system 1000, the ECC circuit 212 generates an ECC code for data corresponding to the writing command, and the memory management circuit 202 writes the data and the corresponding ECC code into the rewritable non-volatile memory module 106. Thereafter, when reading the data from the rewritable non-volatile memory module 106, the memory management circuit 202 simultaneously reads the ECC code corresponding to the data, and the ECC circuit 212 performs the ECC procedure on the read data according to the corresponding ECC code.

Figure 6:
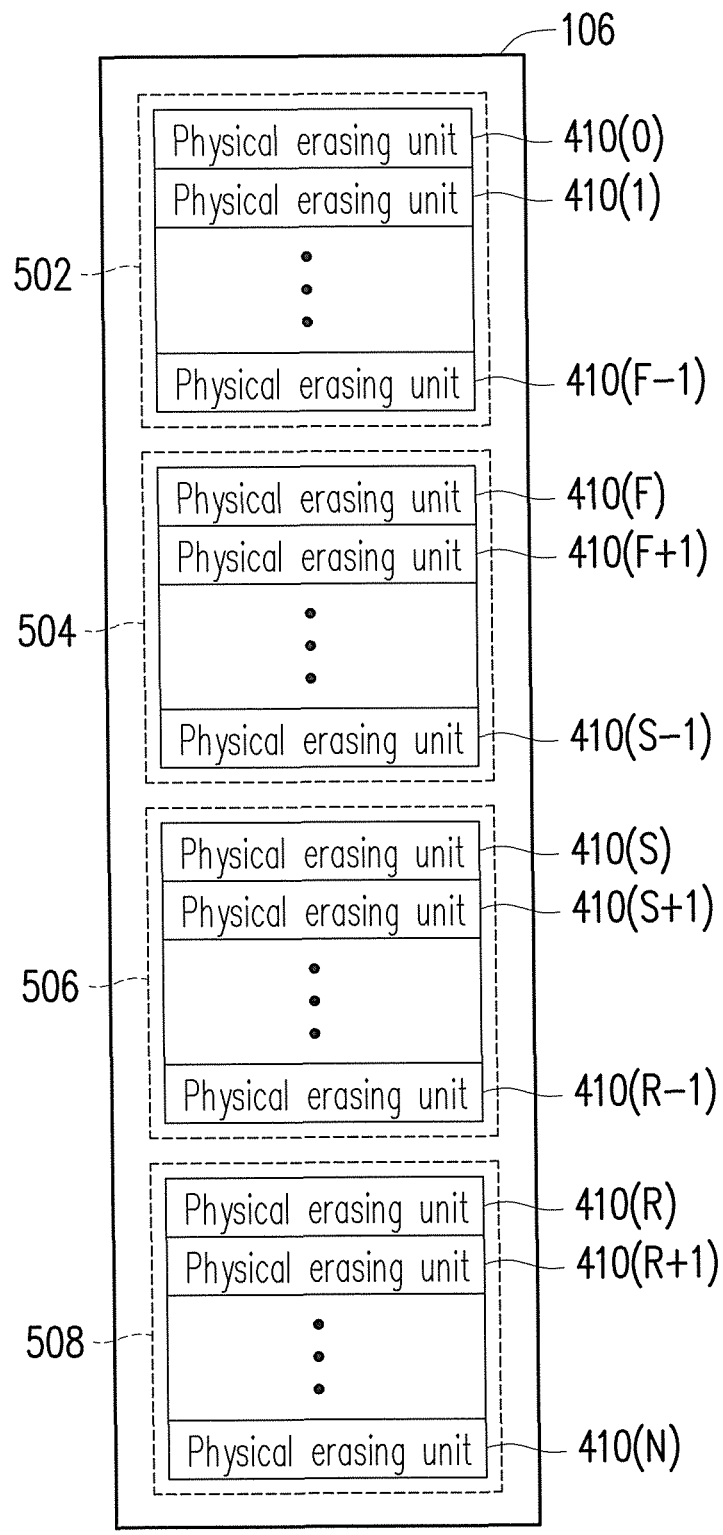
FIG. 6 and FIG. 7 are schematic diagrams illustrating an example of managing physical blocks according to a first exemplary embodiment of the invention.
Figure 7:
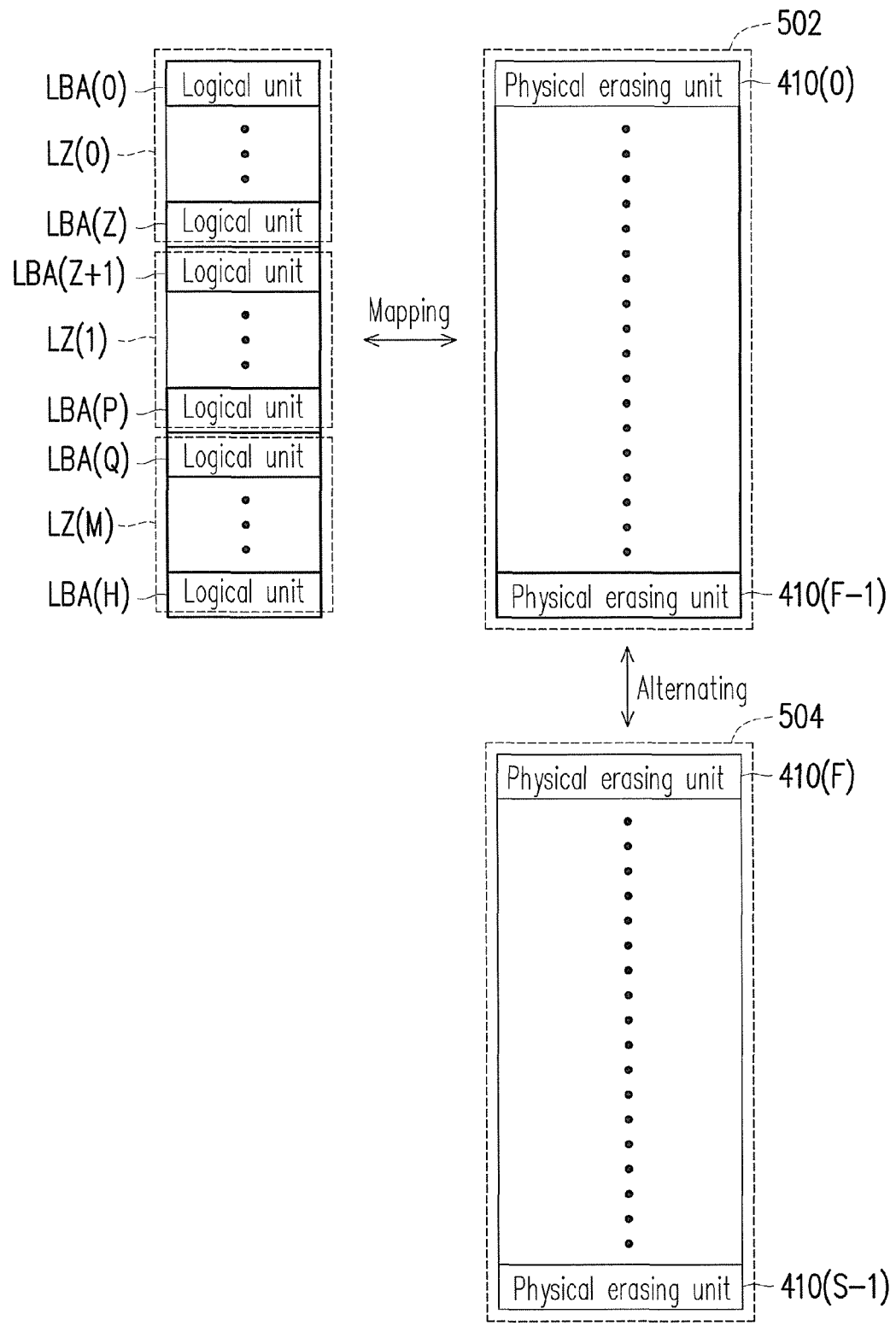

FIG. 6 and FIG. 7 are schematic diagrams illustrating an example of managing physical erasing units according to an exemplary embodiment of the present invention.

With reference to FIG. 6, the memory control circuit unit 104 (or the memory management circuit 202) logically groups the physical erasing units 410(0) to 410(N) into a data area 502, a spare area 504, a system area 506, and a replacement area 508.

The physical erasing units logically belonging to the data area 502 and the spare area 504 are configured for storing data from the host system 1000. Particularly, the physical erasing units belonging to the data area 502 are already configured for storing data, and the physical erasing units belonging to the spare area 504 are configured for replacing the physical erasing units belonging to the data area 502. That is, if the writing commands and the data to be written are received from the host system 1000, the memory management circuit 202 gets physical erasing units from the spare area 504 and writes the data into the gotten physical erasing units for substituting the physical erasing units belonging to the data area 502.

The physical erasing units logically belonging to the system area 506 are used for recording system data. For instance, the system data include the manufacturers and models of the rewritable non-volatile memory module, the number of the physical erasing units in the rewritable non-volatile memory module, the number of the physical programming units in each physical erasing unit, and so on.

The physical erasing units logically belonging to the replacement area 508 are physical erasing units that are applied in a defective physical erasing unit replacement procedure to replace damaged and defective physical erasing units. Particularly, if there are still normal physical erasing units in the replacement area 508, and the physical erasing unit in the data area 502 is damaged, the memory management circuit 202 selects a normal physical erasing unit from the replacement area 508 to replace the damaged physical erasing unit.

Note that the number of physical erasing units respectively belonging to the data area 502, the spare area 504, the system area 506, and the replacement area 508 may vary according to different memory specifications. Additionally, it has to be understood that the grouping relation of associating the physical erasing units with the data area 502, the spare area 504, the system area 506, and the replacement area 508 is dynamically changed during the operation of the memory storage apparatus 100. For instance, if a physical erasing unit belonging to the spare area 504 is damaged and replaced by a physical erasing unit belonging to the replacement area 508, the physical erasing unit originally belonging to the replacement area 508 is associated with the spare area 504.

As indicated in FIG. 7, the memory management circuit unit 104 (or the memory management circuit 202) configures logical units LBA(0) to LBA(H) for mapping to the physical erasing units belonging to the data area 502. Each of the logical units has a plurality of logical sub-units to be mapped to the physical programming units corresponding to the physical erasing units. Besides, if the host system 100 intends to write data into the logical units or update data stored in the logical units, the memory control circuit unit 104 (or the memory management circuit 202) selects one physical erasing unit from the spare area 504 to alternate with one physical erasing unit in the data area 502. In the present exemplary embodiment, the logical sub-units may be logical pages or logical sectors.

In order to identify the actual physical erasing unit where data of each logical unit are stored, the memory control circuit unit 104 (or the memory management circuit 202) records mapping relations between the logical unit and the physical erasing unit according to the present exemplary embodiment. In addition, if the host system 1000 intends to access data in one of the logical sub-units, the memory control circuit unit 104 (or the memory management circuit 202) identifies the logical unit where the logical sub-unit belongs and issues a corresponding command sequence to the rewritable non-volatile memory module 106 to access data in the physical erasing unit mapped to said logical unit. For instance, in the present exemplary embodiment, the memory control circuit unit 104 (or the memory manage-ment circuit 202) stores a logical-to-physical address mapping table in the rewritable non-volatile memory module 106 for recording the physical erasing units respectively mapped to each logical unit. When accessing data, the memory control circuit unit 104 (or the memory management circuit 202) loads the logical-to-physical address mapping table to the buffer memory 208 for data maintenance.

It should be mentioned that the buffer memory 208 may not be able to store the mapping tables recording the mapping relations of all logical units due to its limited capacity. Therefore, in the present exemplary embodiment, the memory control circuit unit 104 (or the memory management circuit 202) groups the logical units LBA(0) to LBA(H) into a plurality of logical zones LZ(0) to LZ(M) and allocates one logical-to-physical address mapping table to each logical zone. Particularly, if the memory control circuit unit 104 (or the memory management circuit 202) updates the mapping relation of one of the logical units, the logical-to-physical address mapping table corresponding to the logical zone of the logical unit is loaded to the buffer memory 208 and is then updated.

As mentioned above, in the present exemplary embodiment, the rewritable non-volatile memory module 106 of the memory storage apparatus 100 performs management by means of the physical programming units; therefore, if the writing command is executed, the memory control circuit unit 104 (or the memory management circuit 202) writes data into the physical programming units one after another no matter which logical sub-unit of the logical unit where data are to be written. Particularly, the memory control circuit unit 104 (or the memory management circuit 202) selects a blank physical erasing unit from the spare area 504 as the currently used physical erasing unit to write data. Once the currently used physical erasing unit is fully written with data, the memory control circuit unit 104 (or the memory management circuit 202) further selects another blank physical erasing unit from the spare area 504 as the currently used physical erasing unit to continuously write data corresponding to the writing command from the host system 1000. In order to prevent exhaustion of the physical erasing units in the spare area 504, if the memory control circuit unit 104 (or the memory management circuit 202) intends to select the physical erasing units from the spare area 504, and the number of the physical erasing units in the spare area 504 is reduced to the preset recycling threshold, the memory control circuit unit 104 (or the memory management circuit 202) performs the data merging process to invalidate the data in at least one of the physical erasing units in the data area 502 and associates the physical erasing units that store the invalid data and are located in the data area 502 with the spare area 502, such that the number of the physical erasing units in the spare area 504 is greater than the preset recycling threshold. For instance, while performing the data merging process, the memory control circuit unit 104 (or the memory management circuit 202) is required to use at least one blank physical erasing unit, and thus the preset recycling threshold is at least greater than one.

As mentioned above, the ECC circuit 212 in the memory storage apparatus 100 is configured to verify whether the data stored in the rewritable non-volatile memory module 106 are correct. However, during the ECC process, the ECC circuit 212 in both the encoding step and the decoding step is required to learn the length of the data to be protected, so as to calculate the correct eigenvalue code and find out the correct error location. In the present exemplary embodiment, if the memory control circuit unit 104 (or the memory management circuit 202) receives data, the memory control circuit unit 104 (or the memory management circuit 202) divides the data into a plurality of frames, and the ECC circuit 212 generates ECC codes corresponding to the frames, respectively, such that the frames and the ECC codes corresponding the frames are respectively encoded to form ECC frames. Here, the size of the ECC frame is determined by the size of the transmission unit, and the size of the transmission unit is determined according to the specification of the rewritable non-volatile memory module 106. Namely, each transmission unit is required to protect a certain number of bits. For instance, if the size of the transmission unit is 512 bytes and the number of the to-be-protected bits is 12 in each transmission unit, the memory control circuit unit 104 (or the memory management circuit 202) divides data into a plurality of frames each being 512 bytes. The ECC circuit 212 performs an error checking and correcting coding process on every 512 bytes of data, and thus the size of each ECC frame is 512 bytes. Note that the invention is not limited thereto, and the size of each ECC frame may be 1 K bytes, 2 K bytes, and so on according to other exemplary embodiments. It should be mentioned that the size of each physical programming unit is at least greater than the size of one ECC frame, such that the data stored in the physical programming unit may, in the unit of the size of the ECC frame, be protected by the ECC circuit 212.

According to the present exemplary embodiment, the maximum protection capacity of the ECC circuit 212 is 12 bits; therefore, if the bit error count in the ECC frame is greater than 12 (e.g., 13), the ECC circuit 212 is no longer able to correct the erroneous data in the ECC frame, such that the data stored in the ECC frame cannot be read and become damaged data that cannot be recovered. Said condition also means that the physical erasing unit having the damaged data is overly aged and can no longer be used. At this time, the memory control circuit unit 104 (or the memory management circuit 202) marks the physical programming unit whose bit error count exceeds the maximum protection capacity of the ECC circuit 212 as the defective physical programming unit and records the same into a defective physical programming unit allocation table.

Figure 8:
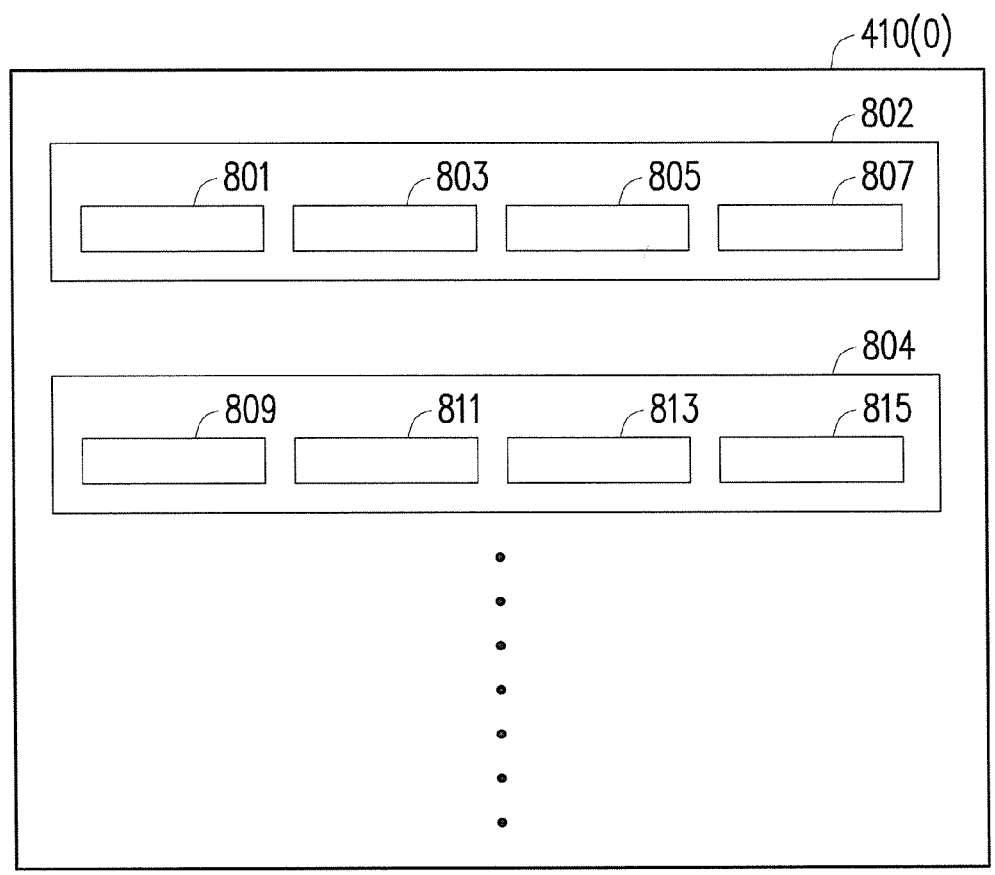
FIG. 8 is a schematic diagram illustrating an example of an error checking and correcting (ECC) frame according to an exemplary embodiment of the invention.

FIG. 8 is a schematic diagram illustrating an example of an error checking and correcting (ECC) frame according to an exemplary embodiment of the present invention.

With reference to FIG. 8, according to the present exemplary embodiment, the capacity of the first physical programming unit 802 in the first physical erasing unit 410(0) stored in the data area 502 is 2 K bytes (2048 bytes), and the first physical programming unit 802 is capable of storing data whose size is equal to four ECC frames, i.e., the first ECC frame 801, the second ECC frame 803, the third ECC frame 805, and the fourth ECC frame 807. The size of each of the ECC frames 801, 803, 805, and 807 is 512 bytes.

During the operation of the rewritable non-volatile memory module 106, the memory control circuit unit 104 (or the memory management circuit 202) continuously records a bit error count in each ECC frame.

For instance, it is assumed that the bit error count of the first ECC frame 801 in the first physical programming unit 802 is 3, the bit error count of the second ECC frame 803 is 4, the bit error count of the third ECC frame 805 is 5, and the bit error count of the fourth ECC frame 807 is 11; the bit error count of the first ECC frame 809 in the second physical programming unit 804 is 3, the bit error count of the second ECC frame 811 is 4, the bit error count of the third ECC frame 813 is 5, and the bit error count of the fourth ECC frame 815 is 6. According to the above, the bit error count of each ECC frame of the physical programming units in each physical erasing unit of the rewritable non-volatile memory module 106 can also be obtained and recorded during the operation of the rewritable non-volatile memory module 106.

In the present exemplary embodiment, the memory control circuit unit 104 (or the memory management circuit 202) determines whether the bit error count of each physical programming unit in the first physical erasing unit 410(0) exceeds the threshold bit error count pre-defined by the system. For example, the threshold bit error count pre-defined by the system is 10. It should be mentioned that the threshold bit error count may be pre-defined when the system is manufactured in the factory or set by software or firmware after the system is manufactured, and the threshold bit error count does not exceed the maximum protection capacity of the ECC circuit 212.

In view of the above, the bit error count of the fourth ECC frame 807 in the first physical programming unit of the first physical erasing unit 410(0) is 11 which exceeds the threshold bit error count (i.e., 10), and the memory control circuit unit 104 (or the memory management circuit 202) records the first physical erasing unit 410(0) into a second-programming-mode-physical-erasing-unit allocation table. The second-programming-mode-physical-erasing-unit allocation table serves to record the physical erasing units operated in the SLC mode among the physical erasing units of the rewritable non-volatile memory module 106. For instance, according to the present exemplary embodiment, the memory control circuit unit 104 (or the memory management circuit 202) stores the second-programming-mode-physical-erasing-unit allocation table into the buffer memory 208, and the memory control circuit unit 104 (or the memory management circuit 202), during the operation of the rewritable non-volatile memory module, continues to record the bit error count of each physical programming unit in each physical erasing unit and updates the second-programming-mode-physical-erasing-unit allocation table.

As described above, the memory control circuit unit 104 (or the memory management circuit 202) records the first physical erasing unit 410(0) into the second-programming-mode-physical-erasing-unit allocation table; in another exemplary embodiment, the memory control circuit unit 104 (or the memory management circuit 202) may also mark the physical erasing unit (in which the bit error count exceeds the threshold bit error count) as a second programming mode physical erasing unit in the system data corresponding to the physical erasing unit. For instance, the system data may be meta data corresponding to the physical erasing unit or may be other type of system data, which should not be construed as a limitation to the invention. Note that the memory control circuit unit 104 (or the memory management circuit 202) may record the physical erasing unit (in which the bit error count exceeds the threshold bit error count) by applying one or both of the above-mentioned methods.

Besides, according to the present exemplary embodiment, as long as the bit error count of any ECC frame of the first physical erasing unit 410(0) exceeds the threshold bit error count, the memory control circuit unit 104 (or the memory management circuit 202) recognizes the first physical erasing unit 410(0) as a defective physical erasing unit and records the first physical erasing unit 410(0) into the second-programming-mode-physical-erasing-unit allocation table or marks the first physical erasing unit 410(0) as the second programming mode physical erasing unit. Note that the present invention is not limited thereto; in another exemplary embodiment, the memory control circuit unit 104 (or the memory management circuit 202) may recognize the physical erasing unit as the defective physical erasing unit if the bit error count of at least two ECC frames in the physical erasing unit exceeds the threshold bit error count. Alternatively, in another exemplary embodiment, the memory control circuit unit 104 (or the memory management circuit 202) may calculate the average bit error count of the ECC frames in one physical erasing unit and recognizes whether the physical erasing unit is a defective physical erasing unit according to whether the average bit error count exceeds the threshold bit error count, given that the bit error counts of the ECC frames in one physical erasing unit does not surpass the maximum protection capacity of the ECC circuit 212.

For instance, according to an exemplary embodiment, if the memory control circuit unit 104 (or the memory management circuit 202) is going to perform an erasing operation on the physical erasing units of the rewritable non-volatile memory module 106, the memory control circuit unit 104 (or the memory management circuit 202) checks and determines whether the physical erasing unit on which the erasing operation is going to be performed is already recorded into the second-programming-mode-physical-erasing-unit allocation table or is already marked as the second programming mode physical erasing unit. If the physical erasing unit on which the erasing operation is going to be performed is already recorded into the second-programming-mode-physical-erasing-unit allocation table or is already marked as the second programming mode physical erasing unit, the memory control circuit unit 104 (or the memory management circuit 202) performs the erasing operation on the physical erasing unit according to a SLC-mode erasing command. If the physical erasing unit on which the erasing operation is going to be performed is neither recorded into the second-programming-mode-physical-erasing-unit allocation table nor marked as the second programming mode physical erasing unit, the memory control circuit unit 104 (or the memory management circuit 202) performs the erasing operation on the physical erasing unit according to an MLC-mode erasing command.

For instance, when the memory control circuit unit 104 (or the memory management circuit 202) is going to perform the erasing operation on the first physical erasing unit 410(0), the memory control circuit unit 104 (or the memory management circuit 202) looks up the second-programming-mode-physical-erasing-unit allocation table or checks and determines whether the first physical erasing unit 410(0) on which the erasing operation is going to be performed is already marked as the second programming mode physical erasing unit, so as to determine whether the erasing operation is performed on the first physical erasing unit 410(0) according to the SLC-mode erasing command or the MLC-mode erasing command. As provided above, once the bit error count of any ECC frame of the first physical erasing unit 410(0) exceeds the threshold bit error count, the first physical erasing unit 410(0) is recorded into the second-programming-mode-physical-erasing-unit allocation table or marked as the second programming mode physical erasing unit. Under said circumstances, if it is required to perform a data merging process on the first physical erasing unit 410(0), the memory control circuit unit 104 (or the memory management circuit 202) performs the erasing operation on the first physical erasing unit 410(0) according to the SLC-mode erasing command after the data in the first physical erasing unit 410(0) have become invalid.

In an exemplary embodiment of the invention, while the memory control circuit unit 104 (or the memory management circuit 202) records the first physical erasing unit 410(0) into the second-programming-mode-physical-erasing-unit allocation table, the memory control circuit unit 104 (or the memory management circuit 202) may copy the valid data stored in the first physical erasing unit 410(0) into the second physical erasing unit 410(F), re-map a logical unit originally mapped to the first physical erasing unit 410(0) to the second physical erasing unit 410(F), and associate the second physical erasing unit 410(F) storing the valid data with the data area 502.

Particularly, in another exemplary embodiment of the invention, while the memory control circuit unit 104 (or the memory management circuit 202) records the first physical erasing unit 410(0) into the second-programming-mode-physical-erasing-unit allocation table, the memory control circuit unit 104 (or the memory management circuit 202) determines whether the data stored in the first physical erasing unit 410(0) are valid; if yes, the memory control circuit unit 104 (or the memory management circuit 202) selects the second physical erasing unit 410(F) from the spare area 504 and copies the valid data stored in the first physical erasing unit 410(0) into the second physical erasing unit 410(F). Note that the bit error count of any of the ECC frames of each physical programming unit in the second physical erasing unit 410(F) selected by the memory control circuit unit 104 (or the memory management circuit 202) is not more than the threshold bit error count. In another exemplary embodiment, the memory control circuit unit 104 (or the memory management circuit 202) may select from the spare area 504 the physical erasing unit that is neither recorded in the second-programming-mode-physical-erasing-unit allocation table nor marked as the second programming mode physical erasing unit to store the valid data. If the spare area 504 merely has the physical erasing unit recorded in the second-programming-mode-physical-erasing-unit allocation table or marked as the second programming mode physical erasing unit, the memory control circuit unit 104 (or the memory management circuit 202) selects such second programming mode physical erasing unit to store the valid data.

After the memory control circuit unit 104 (or the memory management circuit 202) copies the valid data stored in the first physical erasing unit 410(0) into the second physical erasing unit 410(F), the memory control circuit unit 104 (or the memory management circuit 202) re-maps the logical unit originally mapped to the first physical erasing unit 410(0) to the second physical erasing unit 410(F) and associates the second physical erasing unit 410(F) storing the valid data with the data area 502. After that, at the default timing (e.g., when the system is in an idling state), the memory control circuit unit 104 (or the memory management circuit 202) performs the erasing operation directly on the first physical erasing unit 410(0) with the SLC mode and then associates the first physical erasing unit 410(0) (which has undergone the erasing operation) with the spare area 504.

According to the present exemplary embodiment, after the memory control circuit unit 104 (or the memory management circuit 202) performs the erasing operation on a physical erasing unit with the SLC mode, the memory control circuit unit 104 (or the memory management circuit 202) keeps on operating such a physical erasing unit with the SLC mode. For instance, after the memory control circuit unit 104 (or the memory management circuit 202) completes the erasing operation on the first physical erasing unit 410(0)

under the SLC mode, and if the memory control circuit unit 104 (or the memory management circuit 202) intends to select the first physical erasing unit 410(0) and writes data thereinto, the memory control circuit unit 104 (or the memory management circuit 202) merely stores the to-be-written data into the lower physical programming units of the first physical erasing unit 410(0). That is, given that the erasing operation is performed on the second physical erasing unit 410(F) with the MLC mode before the data writing operation, and if the memory control circuit unit 104 (or the memory management circuit 202) intends to write data into the second physical erasing unit 410(F), the data are stored into the lower physical programming units and the upper physical programming units of the second physical erasing unit 410(F).

According to the present exemplary embodiment, the memory control circuit unit 104 (or the memory management circuit 202) sets the data writing mode of the first physical erasing unit 410(0) as the SLC mode through performing the erasing operation on the first physical erasing unit 410(0) with the SLC mode. Afterwards, as long as the memory control circuit unit 104 (or the memory management circuit 202) operates the first physical erasing unit 410(0) with the SLC mode, the memory control circuit unit 104 (or the memory management circuit 202) operates the first physical erasing unit 410(0) according to a SLC-mode command. Any physical erasing unit that is set to be with the SLC mode stays in the SLC mode according to the present exemplary embodiment. In addition, any physical erasing unit that is recorded into the second-programming-mode-physical-erasing-unit allocation table or marked as the second programming mode physical erasing unit keeps on being recorded into the second-programming-mode-physical-erasing-unit allocation table or marked as the second programming mode physical erasing unit. If the bit error count of one of the ECC frame of one of the physical programming units in the physical erasing unit with the SLC mode is more than the threshold bit error count, the memory control circuit unit 104 (or the memory management circuit 202) marks the physical erasing unit as the defective physical erasing unit and records the defective physical erasing unit into a defective physical erasing unit table; meanwhile, the memory control circuit unit 104 (or the memory management circuit 202) selects one blank physical erasing unit from the spare area and stores the valid data originally in the defective physical erasing unit into the selected physical erasing unit, re-maps the logic unit originally mapped to the defective physical erasing unit to the selected physical erasing unit, and removes the defective physical erasing unit from the data area. After that, the memory control circuit unit 104 (or the memory management circuit 202) no longer uses the defective physical erasing unit.

Figure 9:
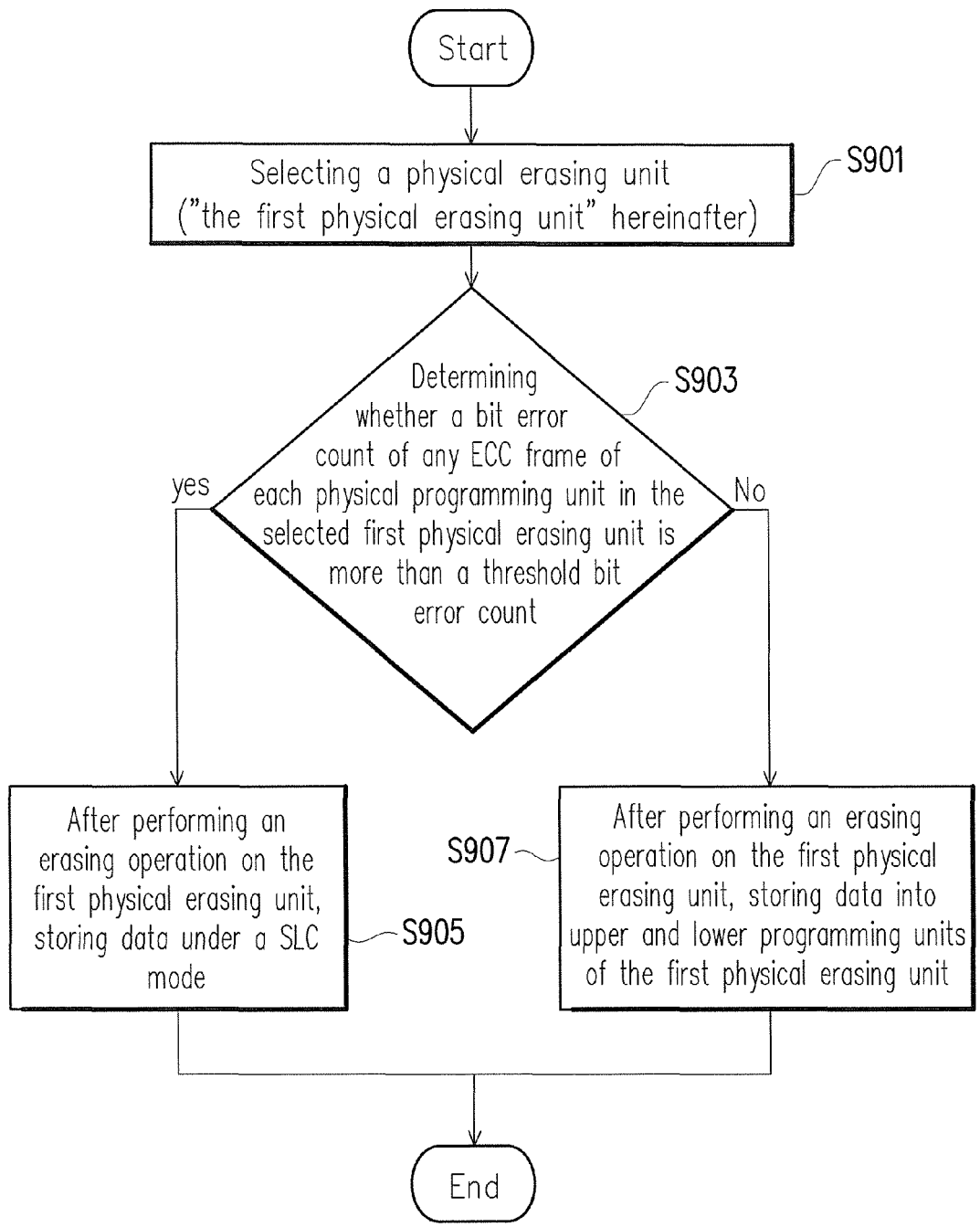
FIG. 9 is a flowchart illustrating a data storing method according to an exemplary embodiment of the invention.

FIG. 9 is a flowchart illustrating a data storing method according to an exemplary embodiment of the present invention.

With reference to FIG. 9, in step S901, the memory control circuit unit 104 (or the memory management circuit 202) selects a physical erasing unit ("the first physical erasing unit" hereinafter). In step S903, the memory control circuit unit 104 (or the memory management circuit 202) determines whether the bit error count of any of the ECC frames of each physical programming unit in the selected first physical erasing unit is more than the threshold bit error count. If yes, in step S905, the memory control circuit unit 104 (or the memory management circuit 202) determines that the data are stored with the SLC mode after the erasing operation is performed on the first physical erasing unit. For instance, as provided above, the memory control circuit unit 104 (or the memory management circuit 202) performs the erasing operation on the first physical erasing unit according to the SLC-mode erasing command, such that the physical programming units of the first physical erasing unit can merely store 1 bit of data after the erasing operation is performed on the first physical erasing unit according to the SLC-mode erasing command.

If the bit error count of one of the ECC frames of the physical programming units of the first physical erasing unit is not more than the threshold bit error count, the memory control circuit unit 104 (or the memory management circuit 202) determines that the data are stored in the upper and lower physical programming units of the first physical erasing unit after the erasing operation is performed on the first physical erasing unit. For instance, as provided above, the memory control circuit unit 104 (or the memory management circuit 202) performs the erasing operation on the first physical erasing unit according to the MLC-mode erasing command, such that the lower and upper physical programming units of the first physical erasing unit simultaneously serve to store data after the erasing operation is performed on the first physical erasing unit according to the MLC-mode erasing command.

In light of the foregoing, according to the present exemplary embodiment, the defective physical erasing unit whose bit error count exceeds the threshold bit error count may be set to be in the SLC mode and may then be further used. Particularly, the potential of memory cells of the defective physical erasing unit in the SLC mode falls within a relatively wide range; therefore, errors that might have occurred in the memory cells no longer occur in these memory cells, the bit error count of the physical programming units in the defective physical erasing unit can be reduced, and stability of data in the defective physical erasing unit can be enhanced. At the same time, since the defective physical erasing unit whose bit error count exceeds the threshold bit error count may be further used, the lifespan of the rewritable non-volatile memory module can be extended.

Second Exemplary Embodiment

The hardware framework provided in the second exemplary embodiment is similar to that provided in the first exemplary embodiment, while the difference therebetween lies in that the defective physical erasing unit is processed in unit of a physical erasing unit according to the first exemplary embodiment, and that the defective physical programming unit is processed in unit of a physical programming unit. The reference numbers and characters used in the first exemplary embodiment are further utilized hereinafter to elaborate the difference between the first and second exemplary embodiments.

While first data is received from the host system 1000, the memory control circuit unit 104 (or the memory management circuit 202) selects a first physical erasing unit 410(0) having available storage capacity, so as to write the first data into the first physical erasing unit 410(0).

As described in the first exemplary embodiment, the memory control circuit unit 104 (or the memory management circuit 202) records the bit error count of each ECC frame in each programming unit of the first physical erasing unit 410(0). As exemplarily shown in FIG. 8, the capacity of the first physical programming unit 802 in the first physical erasing unit 410(0) stored in the data area 502 is 2 K bytes (2048 bytes), and the first physical programming unit 802 is capable of storing data whose size is equal to four ECC frames, i.e., the first ECC frame 801, the second ECC frame 803, the third ECC frame 805, and the fourth ECC frame 807. The size of each of the ECC frames 801, 803, 805, and 807 is 512 bytes. Besides, the capacity of the second physical programming unit 804 is 2 K bytes (2048 bytes), and the second physical programming unit 804 is capable of storing data whose size is equal to four ECC frames, i.e., the first ECC frame 809, the second ECC frame 811, the third ECC frame 813, and the fourth ECC frame 815. The size of each of the ECC frames 809, 811, 813, and 815 is 512 bytes. For instance, it is assumed that the bit error count of the first ECC frame 801 in the first physical programming unit 802 is 3, the bit error count of the second ECC frame 803 is 4, the bit error count of the third ECC frame 805 is 5, and the bit error count of the fourth ECC frame 807 is 11; the bit error count of the first ECC frame 809 in the second physical programming unit 804 is 3, the bit error count of the second ECC frame 811 is 4, the bit error count of the third ECC frame 813 is 5, and the bit error count of the fourth ECC frame 815 is 6.

Before data are written into the physical programming units of the first physical erasing unit 410(0), the memory control circuit unit 104 (or the memory management circuit 202) determines whether the bit error count of any of the ECC frames of the physical programming unit (where data are to be written) is more than the threshold bit error count according to the recorded bit error count of each ECC frame in the physical programming unit. As provided above, the threshold bit error count pre-defined by the system is 10, and the bit error count of the fourth ECC frame of the first physical programming unit 802 in the first physical erasing unit 410(0) is 11 which is more than the threshold bit error count. Thereby, the memory control circuit unit 104 (or the memory management circuit 202) recognizes that the bit error count of one of the ECC frames of the first physical programming unit 802 (where data are to be written) is more than the threshold bit error count and thus writes a dummy data into the entire first physical programming unit 802. The memory control circuit unit 104 (or the memory management circuit 202) then determines whether the bit error count of any of the ECC frames of the next physical programming unit (i.e., the second physical programming unit 804) is more than the threshold bit error count. Since none of the bit error count of the ECC frames of the second physical programming unit 804 is more than the threshold bit error count, the memory control circuit unit 104 (or the memory management circuit 202) writes the first data into the second physical programming unit 804.

In another exemplary embodiment, the memory control circuit unit 104 (or the memory management circuit 202) may not write the dummy data into the first physical programming unit 802 in which the bit error count of one of the ECC frames is more than the threshold bit error count; instead, the memory control circuit unit 104 (or the memory management circuit 202) may mark the first physical programming unit 802 (in which the bit error count of one of the ECC frames is more than the threshold bit error count) as the defective physical programming unit or record the first physical programming unit 802 into a defective physical programming unit table. The memory control circuit unit 104 (or the memory management circuit 202) then determines whether the bit error count of any of the ECC frames of each subsequent physical programming unit is more than the threshold bit error count. After the memory control circuit unit 104 (or the memory management circuit 202) finds out the physical programming unit in which the bit error count of all of the ECC frames is not more than the threshold bit error count, the memory control circuit unit 104 (or the memory management circuit 202) writes the first data into such physical programming unit.

According to the present exemplary embodiment, it should be mentioned that the bit error count of each ECC frame in each physical programming unit is recorded, so as to determine whether the data are written into the selected physical programming unit. However, the present invention is not limited thereto; in another exemplary embodiment, the memory control circuit unit 104 (or the memory management circuit 202) may mark the physical programming unit as the defective physical programming unit or record the physical programming unit into the defective physical programming unit table if the bit error count of any of the ECC frames in the physical programming unit exceeds the threshold bit error count. Thereby, once the data writing command is executed subsequently, the memory control circuit unit 104 (or the memory management circuit 202) may directly fill in the defective physical programming unit with the dummy data according to the marking of the defective physical programming unit or according to the defective physical programming unit table, so as to reduce the time required for writing data and increase the efficiency of the data writing operation.

In another exemplary embodiment, the memory control circuit unit 104 (or the memory management circuit 202) may also checks whether the bit error count of any of the ECC frames of each physical programming unit is more than the threshold bit error count while the system is in an idling state (e.g., while the system has not received any command for a predetermined period of time). The physical programming unit having the ECC frame whose bit error count exceeds the threshold bit error count is referred to as the defective physical programming unit hereinafter. Besides, while any defective physical programming unit is recognized, the memory control circuit unit 104 (or the memory management circuit 202) not only marks or records the defective physical programming unit but also checks whether any valid data are stored in the defective physical programming unit. If there are valid data in the defective physical programming unit, the memory control circuit unit 104 (or the memory management circuit 202) copies the valid data stored in the defective physical programming unit into a normal physical programming unit and re-maps a logical sub-unit originally mapped to the defective physical programming unit to the normal physical programming unit now storing the valid data. After that, if an erasing operation is performed on the physical erasing unit having the defective physical programming unit, the dummy data may be written into the defective physical programming unit according to the marking of the defective physical programming unit or according to the defective physical programming unit table while the valid data are written.

Figure 10:
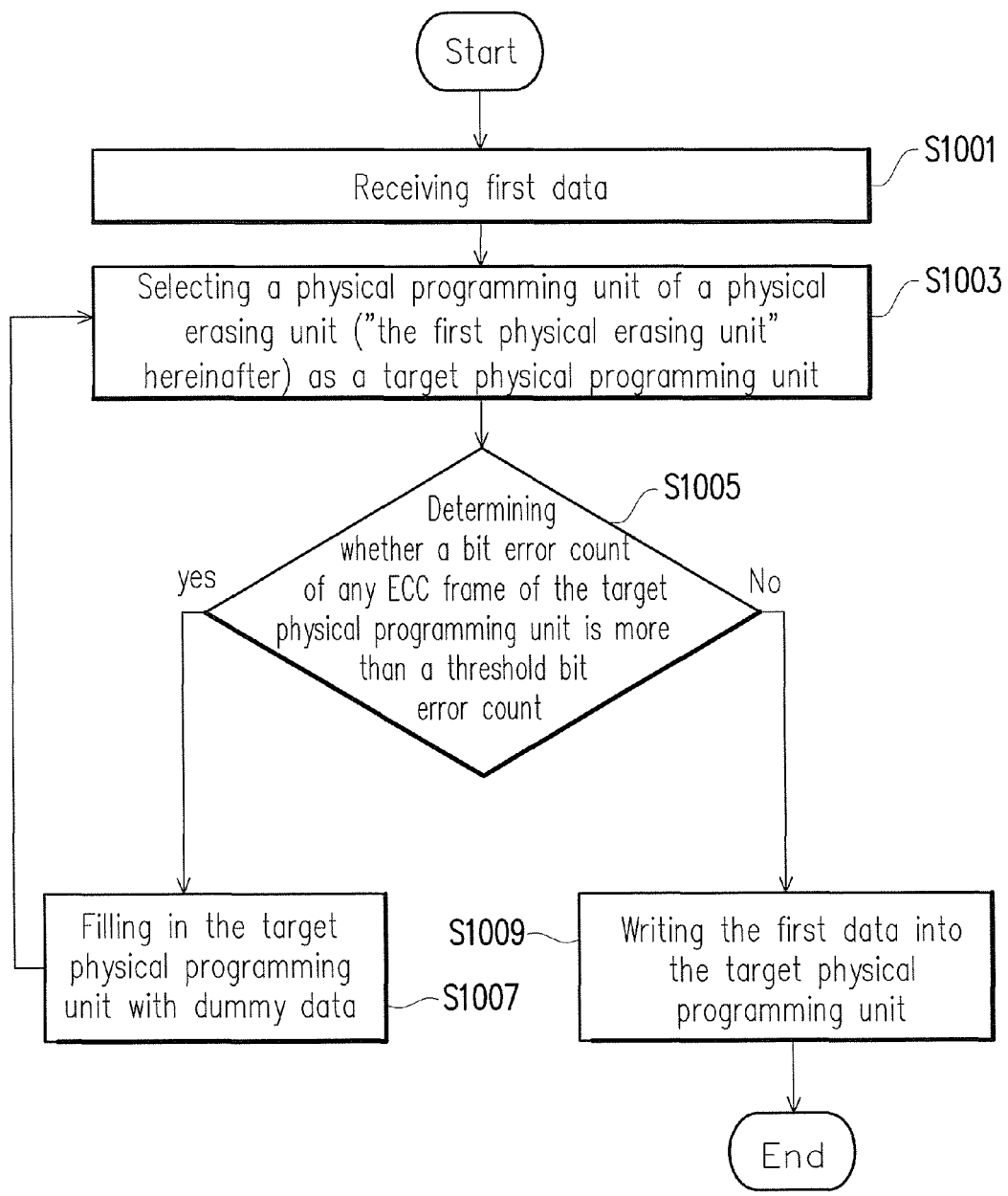
FIG. 10 is a flowchart illustrating a data storing method according to an exemplary embodiment of the invention.

FIG. 10 is a flowchart illustrating a data storing method according to an exemplary embodiment of the present invention.

With reference to FIG. 10, in step S1001, the memory controller 104 (or the memory management circuit 202) receives first data from the host system 1000. In step S1003, the memory control circuit unit 104 (or the memory management circuit 202) selects one of the physical programming units ("the first physical programming unit" hereinafter) of a physical erasing unit ("the first physical erasing unit" hereinafter) as the target physical programming unit. In step S1005, the memory control circuit unit 104 (or the memory management circuit 202) checks whether the bit error count of any of the ECC frames of the target physical programming unit is more than the threshold bit error count. If yes, in step S1007, the memory control circuit unit 104 (or the memory management circuit 202) fills in the target physical programming unit with the dummy data.

After the target physical programming unit is filled in with the dummy data, in step S1003, the memory control circuit unit 104 (or the memory management circuit 202) continues to select one of the physical programming units of the first physical erasing unit as the target physical programming unit. Note that the target physical programming unit selected herein follows the physical programming unit that stores the dummy data. Next, step S1005 is performed.

If in step S1005 none of the bit error count of the ECC frames of the target physical programming unit is more than the threshold bit error count, the memory control circuit unit 104 (or the memory management circuit 202) in step S1009 writes the first data into the target physical programming unit.

As provided above, in the second exemplary embodiment, the defective physical programming unit may be processed in unit of a physical programming unit, so as to prevent data from being written into the defective physical programming unit and prevent possible damages to the data. Besides, the defective physical erasing unit having the defective physical programming unit can be continuously used, which is different from the first exemplary embodiment in which the defective physical erasing unit is set as the second programming mode physical erasing unit and can then be continuously used. Compared to the first exemplary embodiment, the second exemplary embodiment discloses the continuous use of the physical erasing unit (with the relatively large storage capacity) other than the second programming mode physical erasing unit, and the lifespan of the rewritable non-volatile memory module can still be extended.

In another exemplary embodiment, the methods provided in the first and second exemplary embodiments may co-exist. Namely, before writing the first data into the physical erasing unit that is already set to be under the SLC mode, the memory control circuit unit 104 (or the memory management circuit 202) may determine whether there is any defective physical programming unit in such physical erasing unit, write the dummy data into the defective physical programming unit, and write the fist data into the normal physical programming unit. This is similar to that provided in the second exemplary embodiment. Alternatively, instead of writing the dummy data into the defective physical programming unit, the defective physical programming unit may be marked or recorded first, and the first data are then written into the normal physical programming unit. According to another exemplary embodiment, if the second programming mode physical erasing unit includes the defective physical programming units, and if the number of the defective physical programming units exceeds a threshold value, the memory control circuit unit 104 (or the memory management circuit 202) may mark the physical erasing unit as the defective physical erasing unit. Thereby, the lifespan of the second programming mode physical erasing unit can be further extended.

Note that the ECC frames in the exemplary embodiments of the invention serve to check the bit error count of the predetermined areas in each physical programming unit and should not be construed as a limitation to the present invention.

To sum up, the defective physical programming unit or the defective physical erasing unit may be processed in unit of a physical programming unit or a physical programming unit, so as to enhance the stability of stored data; meanwhile, the continuous use of the defective physical erasing or programming unit allows the lifespan of the rewritable non-volatile memory module to be prolonged.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A data storing method for a rewritable non-volatile memory module having a plurality of physical erasing units, each of the physical erasing units having a plurality of physical programming units, the physical programming units comprising a plurality of lower physical programming units and a plurality of upper physical programming units, the data storing method comprising:
   selecting a first physical erasing unit from the physical erasing units, wherein each of the physical programming units of the first physical erasing unit has one or more predetermined areas;
   storing first data with a first programming mode, wherein the first data is programmed into at least one of the lower physical programming units and at least one of the upper physical programming units of the first physical erasing unit;
   recording a bit error count of each of the one or more predetermined areas of the first physical erasing unit;
   determining whether the bit error count of at least one of the one or more predetermined areas of the physical programming units of the first physical erasing unit is more than a threshold bit error count; and
   if the bit error count of the at least one of the one or more predetermined areas of the physical programming units of the first physical erasing unit is more than the threshold bit error count, marking the first physical erasing unit as a second programming mode physical erasing unit and storing second data under a second programming mode after erasing the first data from the first physical erasing unit, wherein the first physical erasing unit is only programmed under the second programming mode after the first physical erasing unit is marked as the second programming mode physical erasing unit,
   wherein the required number of times of programming the rewritable non-volatile memory module under the first programming mode is more than the required number of times of programming the rewritable non-volatile memory module under the second programming mode.

2. The data storing method as recited in claim 1, wherein the second programming mode comprises at least one of a single level cell mode and a lower physical programming mode,
   wherein in the single level cell mode, one memory cell stores 1 bit of data, and
   wherein in the lower physical programming mode, the lower physical programming units are programmed, but the upper physical programming units are not programmed.

3. The data storing method as recited in claim 1, further comprising:
   determining whether the first data is valid before erasing the first data from the first physical erasing unit; and
   if the first data is valid, copying the first data into a second physical erasing unit of the physical erasing units and re-mapping a logical unit mapped to the first physical erasing unit to the second physical erasing unit,
wherein the bit error count of any of the one or more predetermined areas of the second physical erasing unit is not more than the threshold bit error count.

4. The data storing method as recited in claim 1, further comprising:
if the bit error count of the at least one of the one or more predetermined areas of the physical programming units of the first physical erasing unit is more than the threshold bit error count, recording the first physical erasing unit into a second-programming-mode-physical-erasing-unit allocation table.

5. The data storing method as recited in claim 1, further comprising performing an erasing operation on the first physical erasing unit according to a single-level-cell-mode erasing command before storing the second data with a single level cell mode.

6. The data storing method as recited in claim 4, further comprising:
determining whether the first physical erasing unit is recorded into the second-programming-mode-physical-erasing-unit allocation table;
if the first physical erasing unit is recorded into the second-programming-mode-physical-erasing-unit allocation table, performing an erasing operation on the first physical erasing unit according to a single-level-cell-mode erasing command if the first physical erasing unit needs to be erased; and
if the first physical erasing unit is not recorded into the second-programming-mode-physical-erasing-unit allocation table, performing the erasing operation on the first physical erasing unit according to a multi-level-cell-mode erasing command if the first physical erasing unit needs to be erased.

7. The data storing method as recited in claim 1, further comprising:
determining whether the first physical erasing unit is marked as the second programming mode physical erasing unit;
if the first physical erasing unit is marked as the second programming mode physical erasing unit, performing an erasing operation on the first physical erasing unit according to a single-level-cell-mode erasing command if the first physical erasing unit needs to be erased; and
if the first physical erasing unit is not marked as the second programming mode physical erasing unit, performing the erasing operation on the first physical erasing unit according to a multi-level-cell-mode erasing command if the first physical erasing unit needs to be erased.

8. A data storing method for a rewritable non-volatile memory module having a plurality of physical erasing units, each of the physical erasing units having a plurality of physical programming units, the physical programming units comprising a plurality of lower physical programming units and a plurality of upper physical programming units, the data storing method comprising:
receiving first data;
selecting a first physical erasing unit from the physical erasing units, wherein each of the physical programming units of the first physical erasing unit has one or more predetermined areas;
determining whether a bit error count of at least one of the one or more predetermined areas of a first physical programming unit of the physical programming units of the first physical erasing unit is more than a threshold bit error count before programming the first data into the first physical programming unit of the first physical erasing unit; and
if the bit error count of the at least one of the one or more predetermined areas of the first physical programming unit is more than the threshold bit error count, programming the first data into a second physical programming unit of the physical programming units of the first physical erasing unit.

9. The data storing method as recited in claim 8, further comprising:
if the bit error count of the at least one of the one or more predetermined areas of the first physical programming unit is more than the threshold bit error count, programming dummy data into the first physical programming unit.

10. The data storing method as recited in claim 8, wherein the second physical programming unit is different from the first physical programming unit, and a bit error count of each of the one or more predetermined areas of the second physical programming unit is not greater than the threshold bit error count.

11. The data storing method as recited in claim 8, wherein each of the physical programming units stores at least one error checking and correcting frame, and
the size of the one or more predetermined areas is the same as the size of the at least one error checking and correcting frame.

12. A memory control circuit unit configured to control a rewritable non-volatile memory module, the memory control circuit unit comprising:
a host interface configured to be coupled to a host system; and
a memory interface configured to be coupled to the rewritable non-volatile memory module, the rewritable non-volatile memory module having a plurality of physical erasing units, each of the physical erasing units having a plurality of physical programming units, the physical programming units comprising a plurality of lower physical programming units and a plurality of upper physical programming units; and
a memory management circuit coupled to the host interface and the memory interface and configured to select a first physical erasing unit from the physical erasing units, wherein each of the physical programming units of the first physical erasing unit has one or more predetermined areas,
wherein the memory management circuit is further configured to store first data with a first programming mode, the first data is programmed into at least one of the lower physical programming units and at least one of the upper physical programming units of the first physical erasing unit,
wherein the memory management circuit is further configured to record a bit error count of each of the one or more predetermined areas of the first physical erasing unit;
wherein the memory management circuit is further configured to determine whether the bit error count of at least one of the one or more predetermined areas of the physical programming units of the first physical erasing unit is more than a threshold bit error count,
wherein if the bit error count of the at least one of the one or more predetermined areas of the physical programming units of the first physical erasing unit is more than the threshold bit error count, the memory management circuit marks the first physical erasing unit as a second programming mode physical erasing unit and stores second data with a second programming mode after erasing the first data from the first physical erasing unit, wherein the first physical erasing unit is only programmed under the second programming mode after the first physical erasing unit is marked as the second programming mode physical erasing unit, wherein the required number of times of programming the rewritable non-volatile memory module under the first programming mode is more than the required number of times of programming the rewritable non-volatile memory module under the second programming mode.

13. The memory control circuit unit as recited in claim 12, wherein the second programming mode comprises at least one of a single level cell mode and a lower physical programming mode, wherein in the single level cell mode, one memory cell stores 1 bit of data, and wherein in the lower physical programming mode, the lower physical programming units are programmed, but the upper physical programming units are not programmed.

14. The memory control circuit unit as recited in claim 12, wherein before erasing the first data from the first physical erasing unit, the memory management circuit is further configured to determine whether the first data is valid, if the first data is valid, the memory management circuit copies the first data into a second physical erasing unit of the physical erasing units and re-maps a logical unit mapped to the first physical erasing unit to the second physical erasing unit, and the bit error count of any of the one or more predetermined areas of the second physical erasing unit is more than the threshold bit error count.

15. The memory control circuit unit as recited in claim 12, wherein if the bit error count of the at least one of the one or more predetermined areas of the physical programming units of the first physical erasing unit is more than the threshold bit error count, the memory management circuit is further configured to record the first physical erasing unit into a second-programming-mode-physical-erasing-unit allocation table.

16. The memory control circuit unit as recited in claim 12, wherein the memory management circuit is further configured to perform an erasing operation on the first physical erasing unit according to a single-level-cell-mode erasing command before storing the second data under the second programming mode.

17. The memory control circuit unit as recited in claim 16, wherein the memory management circuit is further configured to determine whether the first physical erasing unit is recorded into a second-programming-mode-physical-erasing-unit allocation table, if the first physical erasing unit is recorded into the second-programming-mode-physical-erasing-unit allocation table, the memory management circuit performs the erasing operation on the first physical erasing unit according to the single-level-cell-mode erasing command if the first physical erasing unit needs to be erased, and if the first physical erasing unit is not recorded into the second-programming-mode-physical-erasing-unit allocation table, the memory management circuit performs the erasing operation on the first physical erasing unit according to a multi-level-cell-mode erasing command if the first physical erasing unit needs to be erased.

18. The memory control circuit unit as recited in claim 16, wherein the memory management circuit is further configured to determine whether the first physical erasing unit is marked as the second programming mode physical erasing unit, if the first physical erasing unit is marked as the second programming mode physical erasing unit, the memory management circuit performs the erasing operation on the first physical erasing unit according to the single-level-cell-mode erasing command if the first physical erasing unit needs to be erased, and if the first physical erasing unit is not marked as the second programming mode physical erasing unit, the memory management circuit performs the erasing operation on the first physical erasing unit according to a multi-level-cell-mode erasing command if the first physical erasing unit needs to be erased.

19. A memory control circuit unit configured to control a rewritable non-volatile memory module, the memory control circuit unit comprising:

a host interface configured to be coupled to a host system; and a memory interface configured to be coupled to the rewritable non-volatile memory module, the rewritable non-volatile memory module having a plurality of physical erasing units, each of the physical erasing units having a plurality of physical programming units, the physical programming units comprising a plurality of lower physical programming units and a plurality of upper physical programming units; and a memory management circuit coupled to the host interface and the memory interface and configured to receive first data from the host system, wherein the memory management circuit is further configured to select a first physical erasing unit from the physical erasing units, and each of the physical programming units of the first physical erasing unit has one or more predetermined areas, wherein the memory management circuit is further configured to record a bit error count of each of the one or more predetermined areas of the first physical erasing unit;

wherein the memory management circuit is further configured to determine whether the bit error count of at least one of the one or more predetermined areas of a first physical programming unit of the physical programming units of the first physical erasing unit is more than a threshold bit error count before programming the first data into the first physical programming unit of the first physical erasing unit, if the bit error count of the at least one of the one or more predetermined areas of the first physical programming unit is more than the threshold bit error count, the memory management circuit programs the first data into a second physical programming unit of the physical programming units of the first physical erasing unit.

20. The memory control circuit unit as recited in claim 19, wherein if the bit error count of the at least one of the one or more predetermined areas of the first physical programming unit is more than the threshold bit error count, the memory management circuit programs dummy data into the first physical programming unit.

21. The memory control circuit unit as recited in claim 19, wherein the second physical programming unit is different from the first physical programming unit, and a bit error count of each of the one or more predetermined areas of the second physical programming unit is not greater than the threshold bit error count.

22. The memory control circuit unit as recited in claim 19, wherein each of the physical programming units stores at least one error checking and correcting frame, and
the size of the one or more predetermined areas is the same as the size of the at least one error checking and correcting frame.

23. A memory storage apparatus comprising:
a connection interface unit configured to be coupled to a host system;
a rewritable non-volatile memory module having a plurality of physical erasing units, each of the physical erasing units having a plurality of physical programming units, the physical programming units comprising a plurality of lower physical programming units and a plurality of upper physical programming units; and
a memory control circuit unit coupled to the connection interface unit and the rewritable non-volatile memory module and configured to select a first physical erasing unit from the physical erasing units, wherein each of the physical programming units of the first physical erasing unit has one or more predetermined areas,
wherein the memory control circuit unit is further configured to store first data with a first programming mode, the first data is programmed into at least one of the lower physical programming units and at least one of the upper physical programming units of the first physical erasing unit,
wherein the memory control circuit unit is further configured to record a bit error count of each of the one or more predetermined areas of the first physical erasing unit,
wherein the memory control circuit unit is further configured to determine whether the bit error count of at least one of the one or more predetermined areas of the physical programming units of the first physical erasing unit is more than a threshold bit error count,
wherein if the bit error count of the at least one of the one or more predetermined areas of the physical programming units of the first physical erasing unit is more than the threshold bit error count, the memory control circuit unit marks the first physical erasing unit as a second programming mode physical erasing unit and stores second data with a second programming mode after erasing the first data from the first physical erasing unit, wherein the first physical erasing unit is only programmed under the second programming mode after the first physical erasing unit is marked as the second programming mode physical erasing unit,
wherein the required number of times of programming the rewritable non-volatile memory module under the first programming mode is more than the required number of times of programming the rewritable non-volatile memory module under the second programming mode.

24. The memory storage apparatus as recited in claim 23, wherein the second programming mode comprises at least one of a single level cell mode and a lower physical programming mode,
wherein in the single level cell mode, one memory cell stores 1 bit of data, and wherein in the lower physical programming mode, the lower physical programming units are programmed, but the upper physical programming units are not programmed.

25. The memory storage apparatus as recited in claim 23, wherein
before erasing the first data from the first physical erasing unit, the memory control circuit unit is further configured to determine whether the first data is valid,
if the first data is valid, the memory control circuit unit copies the first data into a second physical erasing unit of the physical erasing units and re-maps a logical unit mapped to the first physical erasing unit to the second physical erasing unit,
and the bit error count of any of the one or more predetermined areas of the second physical erasing unit is more than the threshold bit error count.

26. The memory storage apparatus as recited in claim 23, wherein
if the bit error count of the at least one of the one or more predetermined areas of the physical programming units of the first physical erasing unit is more than the threshold bit error count, the memory control circuit unit is further configured to record the first physical erasing unit into a second-programming-mode-physical-erasing-unit allocation table.

27. The memory storage apparatus as recited in claim 23, wherein the memory control circuit unit is further configured to perform an erasing operation on the first physical erasing unit according to a single-level-cell-mode erasing command before storing the second data under the second programming mode.

28. The memory storage apparatus as recited in claim 27, wherein
the memory control circuit unit is further configured to determine whether the first physical erasing unit is recorded into a second-programming-mode-physical-erasing-unit allocation table,
if the first physical erasing unit is recorded into the second-programming-mode-physical-erasing-unit allocation table, the memory control circuit unit performs the erasing operation on the first physical erasing unit according to the single-level-cell-mode erasing command if the first physical erasing unit needs to be erased, and
if the first physical erasing unit is not recorded into the second-programming-mode-physical-erasing-unit allocation table, the memory control circuit unit performs the erasing operation on the first physical erasing unit according to a multi-level-cell-mode erasing command if the first physical erasing unit needs to be erased.

29. The memory storage apparatus as recited in claim 27, wherein
the memory control circuit unit is further configured to determine whether the first physical erasing unit is marked as the second programming mode physical erasing unit,
if the first physical erasing unit is marked as the second programming mode physical erasing unit, the memory control circuit unit performs the erasing operation on the first physical erasing unit according to the single-level-cell-mode erasing command if the first physical erasing unit needs to be erased, and
if the first physical erasing unit is not marked as the second programming mode physical erasing unit, the memory control circuit unit performs the erasing operation on the first physical erasing unit according to a multi-level-cell-mode erasing command if the first physical erasing unit needs to be erased.

30. A memory storage apparatus comprising:
a connection interface unit configured to be coupled to a host system;
a rewritable non-volatile memory module having a plurality of physical erasing units, each of the physical erasing units having a plurality of physical programming units, the physical programming units comprising a plurality of lower physical programming units and a plurality of upper physical programming units; and
a memory control circuit unit coupled to the connection interface unit and the rewritable non-volatile memory module and configured to receive first data from the host system,
wherein the memory control circuit unit is further configured to select a first physical erasing unit from the physical erasing units, and each of the physical programming units of the first physical erasing unit has one or more predetermined areas,
wherein the memory control circuit unit is further configured to record a bit error count of each of the one or more predetermined areas of the first physical erasing unit;
wherein the memory control circuit unit is further configured to determine whether the bit error count of at least one of the one or more predetermined areas of a first physical programming unit of the physical programming units of the first physical erasing unit is more than a threshold bit error count before programming the first data into the first physical programming unit of the first physical erasing unit,
if the bit error count of the at least one of the one or more predetermined areas of the first physical programming unit is more than the threshold bit error count, the memory control circuit unit programs the first data into a second physical programming unit of the physical programming units of the first physical erasing unit.

31. The memory storage apparatus as recited in claim 30, wherein if the bit error count of the at least one of the one or more predetermined areas of the first physical programming unit is more than the threshold bit error count, the memory control circuit unit programs a dummy data into the first physical programming unit.

32. The memory storage apparatus as recited in claim 30, wherein the second physical programming unit is different from the first physical programming unit, and a bit error count of each of the one or more predetermined areas of the second physical programming unit is not greater than the threshold bit error count.

33. The memory storage apparatus as recited in claim 30, wherein each of the physical programming units stores at least one error checking and correcting frame, and
the size of the one or more predetermined areas is the same as the size of the at least one error checking and correcting frame.

* * * * *